United States Patent
Fang et al.

(10) Patent No.: US 8,526,202 B2
(45) Date of Patent: Sep. 3, 2013

(54) SYSTEM AND METHOD FOR SYNCHRONOUS RECTIFIER

(75) Inventors: ShaoHua Fang, Shanghai (CN); BaoZhen Chen, Ames, IA (US); Qiang Zong, Shanghai (CN); YaJiang Zhu, Shanghai (CN)

(73) Assignee: BCD Semiconductor Manufacturing Limited, George Town, Grand Cayman (KY)

( * ) Notice: Subject to any disclaimer, the term of this patent is extended or adjusted under 35 U.S.C. 154(b) by 469 days.

(21) Appl. No.: 12/604,246

(22) Filed: Oct. 22, 2009

(65) Prior Publication Data

US 2011/0096578 A1    Apr. 28, 2011

(51) Int. Cl.
*H02M 7/217* (2006.01)

(52) U.S. Cl.
USPC .................................... 363/21.14; 363/127

(58) Field of Classification Search
USPC .................... 363/21.14, 127, 21.06
See application file for complete search history.

(56) References Cited

U.S. PATENT DOCUMENTS

| | | | | |
|---|---|---|---|---|
| 5,719,755 A * | 2/1998 | Usui | ............................... | 363/19 |
| 5,946,207 A * | 8/1999 | Schoofs | ........................ | 363/127 |
| 6,438,009 B2 * | 8/2002 | Assow | .......................... | 363/127 |
| 6,459,595 B2 * | 10/2002 | Assow | ........................ | 363/21.14 |
| 6,747,880 B2 * | 6/2004 | Grover | ........................ | 363/21.06 |
| 6,917,235 B2 * | 7/2005 | Dupuy et al. | .................. | 327/333 |
| 7,030,668 B1 * | 4/2006 | Edwards | ..................... | 327/143 |
| 7,262,977 B2 * | 8/2007 | Kyono | ......................... | 363/21.06 |
| 7,385,832 B2 * | 6/2008 | Allinder | ..................... | 363/21.14 |
| 7,636,249 B2 * | 12/2009 | Hu | ................................. | 363/127 |
| 7,787,264 B2 * | 8/2010 | Yang et al. | .................. | 363/21.06 |
| 7,889,521 B2 * | 2/2011 | Hsu | .............................. | 363/21.14 |
| 8,248,145 B2 * | 8/2012 | Melanson | ..................... | 327/432 |
| 2008/0247196 A1 * | 10/2008 | Strijker | ....................... | 363/21.06 |
| 2008/0304305 A1 * | 12/2008 | Chang et al. | .................. | 363/147 |

* cited by examiner

*Primary Examiner* — Harry Behm
(74) *Attorney, Agent, or Firm* — Kilpatrick Townsend & Stockton LLP

(57) ABSTRACT

A synchronous rectification circuit for a power converter includes a power switch coupled to a transformer and an output capacitor and a switching control circuit configured to provide a control signal to the power switch in response to a first state and a second state of the voltage across the power switch. In the switching control circuit, the second state is determined prior to the first state is determined. In an embodiment, the switching control circuit includes a voltage comparing unit configured to act in response to the first and second inputs. The voltage comparing unit is also configured to output a logic signal according to the voltage difference between the sensed voltage drop across the power switch and a reference threshold voltage. A logic processing circuit is coupled to the voltage comparing unit and configured to provide the first state and the second state of the voltage across the power switch.

16 Claims, 9 Drawing Sheets

SYSTEM AND METHOD FOR SYNCHRONOUS RECTIFIER

CROSS-REFERENCES TO RELATED APPLICATIONS

Not Applicable

BACKGROUND OF THE INVENTION

The present invention relates generally to power supply controllers. More particularly, the present invention relates to synchronous rectifiers (SR) used in a power converter to simplify circuit design and improve power efficiency. A specific embodiment of the present invention relates to efficient and low-cost driving and control of a power metal-oxide-semiconductor field effect transistor (MOSFET) in a synchronous rectifier for power converters.

Switching mode power control techniques have found wide applications in computer and electronic equipment power supplies. The popularity of switching mode power supplies (SMPS) are, in part, due to their compactness, stability, efficiency, and lower cost, compared to traditional linear transformer circuits.

The flyback converter is one of the common topologies among the numerous varieties of power converters. A typical flyback converter includes a transformer having a primary winding and a secondary winding, and sometimes a third or more windings for control purposes. This transformer provides a galvanic isolation between the input and the output, and is often used in low-power low-cost power supplies.

In order to provide a DC voltage, diode rectification has been used for many years in switching mode power supplies. However, the scaling down of semiconductor technology calls for lower voltage and larger current power supply. While the diode forward drop voltage cannot be scaled down further, diode rectification can no long meet the smallness, thinness, and high-efficiency requirements desired by the consumer. Furthermore, since the circuit loss is proportional to output current, diode rectification suffers from excessive loss with large output current. For example, for low voltage drop purpose, a Schottky diode is typically employed which has a forward voltage drop of around 500 mV. For 3V output application, this limits the theoretical efficiency of a DC/DC power converter to 83 percent, even if other losses are not taken into account. For a 2V application, the efficiency is even lower and becomes unacceptable.

As a result, nowadays more and more attention is paid to synchronous rectification method using a synchronous rectifier (SR). In some examples, an SR uses a power MOSFET to replace the diode.

Even though widely used, conventional synchronous rectifiers suffer from many limitations. Theses limitations include high cost and complex circuit. More details of these and other limitations are described below.

Therefore, there is a need for methods and systems for improved synchronous rectifiers.

BRIEF SUMMARY OF THE INVENTION

Some embodiments of the present invention provide a flyback converter with a synchronous rectifier by using a voltage difference across the synchronous rectifier to detect a current in a secondary winding of the transformer. Certain embodiments of the present invention can eliminate the need for the additional transformer or hall element used in conventional synchronous rectification designs. Embodiments of the invention can also reduce component counts of the controller and can be integrated in to one single controller IC to replace the rectifying diode.

Some embodiments of the invention are configured to increase power conversion efficiency of a flyback converter operating in discontinuous mode (DCM) and avoid secondary current backflow through the synchronous rectifier. Meanwhile, the circuit design can be simplified to increase the production yield and decrease the cost.

According to a specific embodiment, a flyback converter with synchronous rectifier includes a transformer. The primary side of the transformer is coupled to a rectified DC power supply and a power switching device, which can be a BJT or an MOSFET. In one embodiment, the secondary side includes a secondary winding coupled to a synchronous rectifier and an output capacitor. An external controller IC switches the power switching device on/off at a high frequency to power the primary winding, outputting a high frequency pulse current to the transformer. The primary winding of the transformer receives these high frequency pulses. When the power switching device is turned off, the energy stored in the primary winding is transferred to the secondary winding and stored on the output capacitor.

In some embodiments of the invention, the synchronous rectifier includes a power MOSFET. The synchronous rectifier controller includes a voltage comparing unit having two inputs coupled to the drain and source terminals of the MOSFET, respectively. In an embodiment, the synchronous rectifier samples the voltage difference across the drain and source terminals of the power MOSFET. By comparing this voltage difference with a reference threshold voltage, the comparator gives a corresponding response, which is processed by a logic processing unit and then used to drive the synchronous rectifier.

In a specific embodiment, in one switching cycle, when the primary switching device is turned off, a current flows through the parasitic body diode of the power MOSFET before the synchronous rectifier circuit responds to turn on the MOSFET, creating a voltage drop 0.7~1.2V across the MOSFET's drain and source terminals. This voltage difference is sensed by the differential inputs of the voltage comparing unit. The voltage comparing unit outputs an enable signal. After processed by the logic processing circuit, the enable signal turns on the MOSFET. After the turning on of the MOSFET, the majority of the current in the secondary winding will flow through the MOSFET, while the body diode is bypassed. The voltage drop across the MOSFET can be less than 0.2V due to a small on resistance $R_{DS}(on)$. As the current in the secondary winding decreases, the voltage across the MOSFET also decreases. When the voltage across the MOSFET has dropped to a certain preset threshold voltage, the synchronous control circuit switches off the MOSFET. After a short period of discontinuous state, the power switch is turned on and the converter is back to the charging state. Thus, a switching cycle is completed.

In an embodiment, to eliminate the vibration of the driving signal of the synchronous rectifier, a logic processing unit is coupled between the output of the voltage comparing unit and the control terminal of the synchronous rectifier, e.g., the gate terminal of the MOSFET. To improve the performance, this logic processing unit can be designed with minimum geometry logic gates to reduce the time delay.

In some embodiments of the present invention, a synchronous rectification circuit for a power converter includes a power switch coupled to a transformer and an output capacitor and a switching control circuit configured to provide a control signal to the power switch in response to a first state and a second state of the voltage across the power switch. In the switching control circuit, the second state is determined prior to the first state is determined.

In an embodiment of the above synchronous rectification circuit, the switching control circuit includes first and second inputs configured for coupling to a positive and a negative terminals of the power switch and sensing a voltage across that power switch, and an output terminal, configured for outputting a signal to drive the power switch. A voltage comparing unit is configured to act in response to the first and second inputs. The voltage comparing unit is also configured to output a logic signal according to the voltage difference between the sensed voltage drop across the power switch and a reference threshold voltage. A logic processing circuit is coupled to the voltage comparing unit and configured to provide the first state and the second state of the voltage across the power switch.

In an embodiment, the logic process unit includes an input terminal for receiving an input signal, a delay module coupled to the input terminal, an SR flip-flop coupled to the input terminal and the delay module, a NAND logic gate coupled to the input terminal and the SR flip-flop, and a drive circuit coupled to the output of the logic processing unit and the output terminal of the synchronous rectification circuit. The delay module is configured to provide a delay time between the determination of the first state and the second state of the voltage across the power switch.

In an embodiment, the voltage comparing unit includes a comparator having two inputs and two voltage divider circuits. Each of the voltage divider circuits includes a resistor string configured as a voltage divider and coupled to the power switch, and a diode coupled to the resistor string and configured to prevent current back flow. Each of the two inputs of the comparator is coupled to an internal node of each of the voltage dividers, respectively. The resistor string is configured to set a desired offset voltage and to cause the voltage input from the voltage comparing unit to fall into a common mode input range of the comparator.

In an alternative embodiment, the voltage comparing unit comprises a high-voltage comparator, having a built in system offset. In yet another embodiment, the power switch is provided in a first integrated circuit chip, and the switching control circuit is included in a second integrated circuit chip. In another embodiment, the power switch is provided in a high-voltage integrated circuit chip, and the switching control circuit is included in a low-voltage integrated circuit chip.

In some embodiments, the synchronous rectification circuit is powered by a single power supply. In an embodiment, the synchronous rectification circuit is powered by the output of the flyback converter.

In some embodiments, the power switch is a P type MOSFET or an N type MOSFET. In certain embodiment, the MOSFET has a parasitic body diode, which serves as a rectification diode.

An alternative embodiment of the present invention provides an integrated three-pin rectifier for a power converter, which includes a ground pin. an input pin coupled to a transformer and configured for voltage sensing and receiving a current input, and an output pin coupled to an output terminal of the power converter. A power switch is coupled to the input pin and the output pin. A switching control circuit is configured to generate a control signal in response to voltage difference between the voltage drop across the power switch and a reference threshold voltage. The control signal is coupled to turn on the power switch for a time period correlated to a forward voltage drop across the power switch. In an embodiment, the switching control circuit is powered by the output pin and the ground pin.

In an embodiment of the above integrated three-pin rectifier, the switching control circuit is configured to provide the control signal to the power switch in response to a first state of a voltage across the power switch and a second state of the voltage across the power switch. In this embodiment, the second state is determined prior to the first state is determined.

In the integrated three-pin rectifier, the switching control circuit includes first and second inputs configured for coupling to a positive and a negative terminals of the power switch and sensing a voltage across that power switch, and an output terminal configured for outputting a signal to drive the power switch. A voltage comparing unit is configured to act in response to the first and second inputs, and is configured to output a logic signal according to the voltage difference between the sensed voltage drop across the power switch and a reference threshold voltage. Moreover, a logic processing circuit is coupled to the voltage comparing unit and configured to provide the first state and the second state of the voltage across the power switch.

According to yet another embodiment of the invention, a switching control circuit for a synchronous rectifier includes first and second inputs configured for coupling to a positive and a negative terminals of a power switch and sensing a voltage across that power switch, and an output terminal configured for outputting a signal to drive the power switch. A voltage comparing unit, configured to act in response to the first and second inputs, and is configured to output a logic signal according to the voltage difference between the sensed voltage drop across the power switch and a reference threshold voltage. A logic processing circuit is coupled to the voltage comparing unit and configured to provide the first state and the second state of the voltage across the power switch.

In an embodiment of the above switching control circuit, the logic process unit includes an input terminal for receiving an input signal, a delay module coupled to the input terminal, an SR flip-flop coupled to the input terminal and the delay module, and a NAND logic gate coupled to the input terminal and the SR flip-flop. A drive circuit is coupled to the output of the logic processing unit and the output terminal of the synchronous rectification circuit. In the logic processing unit, the delay module is configured to provide a delay time between the determination of the first state and the second state of the voltage across the power switch.

In another embodiment, the voltage comparing unit includes a comparator having two inputs and two voltage divider circuits. Each of the voltage divider circuits has resistor string and a diode. The resistor string is configured as a voltage divider and coupled to the power switch. The resistor string is also configured to set a desired offset voltage and to cause the voltage input from the voltage comparing unit to fall into a common mode input range of the comparator. The diode is coupled to the resistor string and configured to prevent current back flow. In an embodiment, each of the two inputs of the comparator is coupled to an internal node of each of the voltage dividers, respectively. In a specific embodiment, the switching control circuit is included in a low-voltage integrated circuit chip.

A still another embodiment of the invention provides a power converter having a synchronous rectifier. The power converter includes a transformer, an output capacitor, a power switch, and a switching control circuit. The power switch is coupled to the transformer and the output capacitor. The switching control circuit is configured to provide a control signal to the power switch in response to a first state of a voltage across the power switch and a second state of the voltage across the power switch. In some embodiment, the second state is determined prior to the first state is determined.

In an embodiment of the above converter, the switching control circuit includes first and second inputs configured for coupling to a positive and a negative terminals of a power switch and sensing a voltage across that power switch, and an output terminal configured for outputting a signal to drive the power switch. A voltage comparing unit, configured to act in response to the first and second inputs, and is configured to output a logic signal according to the voltage difference between the sensed voltage drop across the power switch and a reference threshold voltage. A logic processing circuit is coupled to the voltage comparing unit and configured to provide the first state and the second state of the voltage across the power switch.

In an embodiment of the converter, the logic process unit includes an input terminal for receiving an input signal, a delay module coupled to the input terminal, an SR flip-flop coupled to the input terminal and the delay module, and a NAND logic gate coupled to the input terminal and the SR flip-flop. A drive circuit is coupled to the output of the logic processing unit and the output terminal of the synchronous rectification circuit. In the logic processing unit, the delay module is configured to provide a delay time between the determination of the first state and the second state of the voltage across the power switch.

A further understanding of the nature and advantages of the present invention may be realized by reference to the remaining portions of the specification and the drawings.

DETAILED DESCRIPTION OF THE INVENTION

As described above, in some power supplies, a synchronous rectifier (SR) uses a power MOSFET to replace the rectifier diode. Although the on-resistance of the MOSFET can cause $R_{DS}(on)$ loss, SR is still highly effective since the $R_{DS}(on)$ loss is somewhat limited. In DC/DC power converters, synchronous rectification has been widely used. Synchronous rectification has been applied in forward converters or resonant converters. In flyback power converters, synchronous rectification has just begun to be implemented. However, many conventional SR uses current sensors to detect the current polarity in the secondary winding. These approaches usually require an additional transformer and other discrete elements, which result in complicated circuit design and additional cost.

Some embodiments of the present invention detect the polarity of the current directly across the MOSFET. The control circuit does not need additional discrete elements and can be integrated with the synchronous rectifier. Furthermore, the control circuit and the MOSFET can be integrated into one single IC with only three pins, which will result in lower cost and ease of design.

Figure 1:
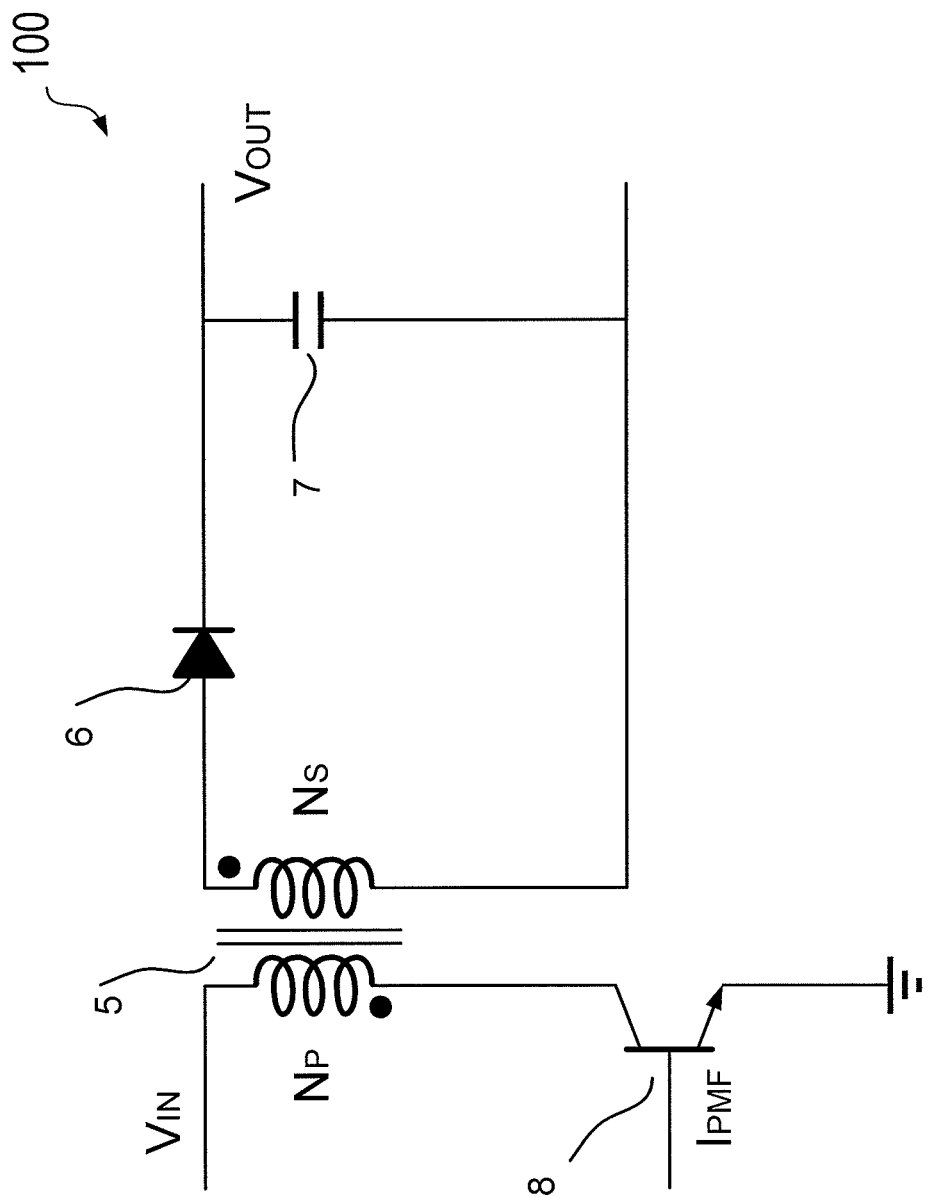
FIG. 1 is a schematic diagram of a conventional flyback converter power supply using a diode rectifier.

One type of AC/DC converter is a conventional flyback converter illustrated in FIG. 1. An AC/DC converter is often used to provide a DC output voltage from the AC input line. The magnitude of the output voltage is usually much less than the AC input and independent of the AC input in a wide range. As depicted in FIG. 1, flyback converter 100 includes a raw DC input, labeled Vin, rectified from the AC input line and coupled to the primary winding Np of a transformer 5. A power switch 8, which is typically a power MOSFET or power BJT, is coupled between Np and the ground. A secondary winding Ns is coupled to a switching diode 6 and an output capacitor 7, where the output voltage is provided.

When power switch 8 is turned on, a current is developed in primary winding Np. Meanwhile the diode rectifier on the secondary side is reverse-biased, and the current path via the secondary winding is blocked. During this time, the primary winding serves as an energy storing element. In the second step, when power switch 8 is turned off, the AC source is disconnected from the primary winding, and the energy is commutated to the output capacitor through the secondary winding.

Figure 2:
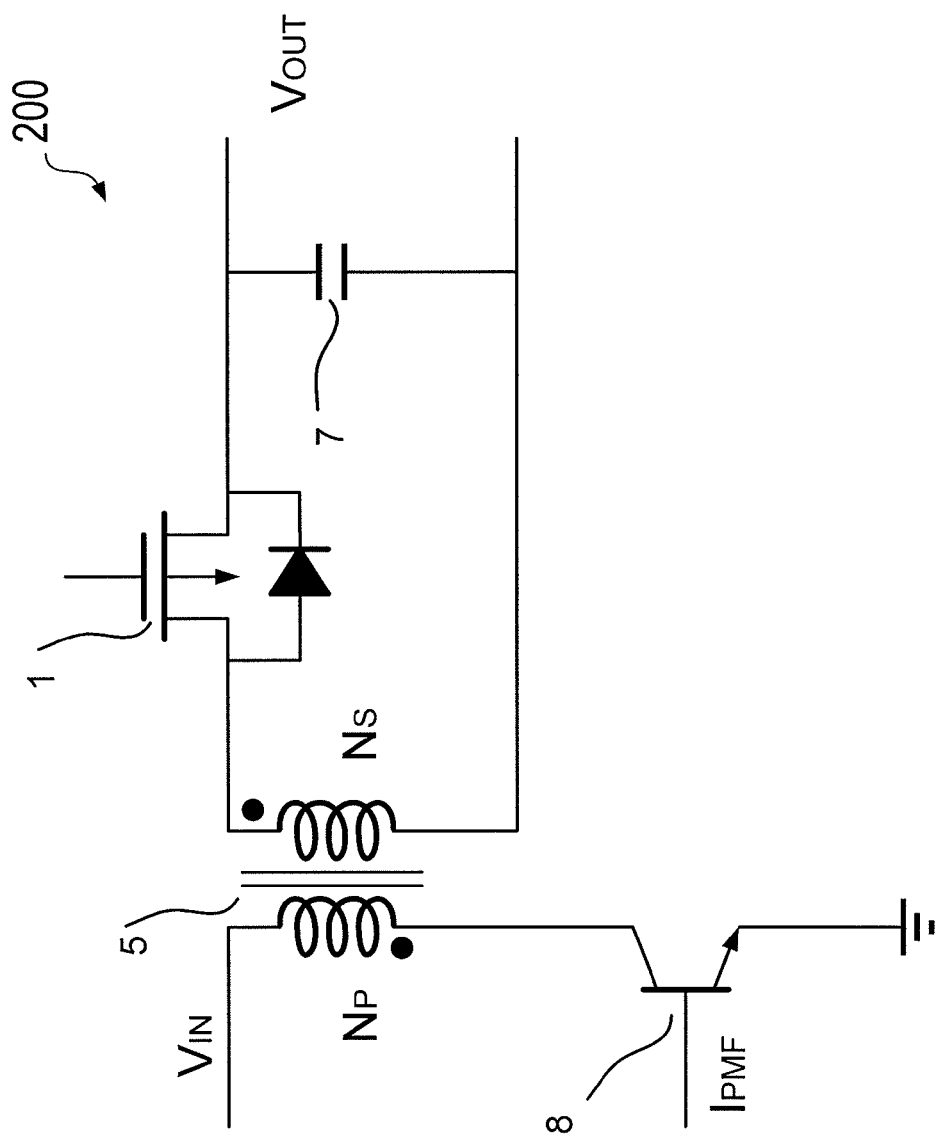
FIG. 2 is a schematic diagram of a conventional flyback converter power supply using a MOSFET as a synchronous rectifier.

A conventional flyback converter using an MOSFET used as synchronous rectifier is illustrated in FIG. 2. As shown, flyback converter 200 includes a transformer 5 with the primary side coupled to a rectified DC power source Vin and a power switch 8. The secondary side of transformer 5 is connected to an output capacitor 7 at its ground terminal. Unlike conventional diode rectification, the other terminal of the secondary winding is connected to a synchronous rectifier which is typically a power MOSFET to reduce the rectification power loss. The MOSFET is often driven in response to a current sensing element which might be a current transformer (CT), a Hall element, or a sensing resistor.

Figure 3:
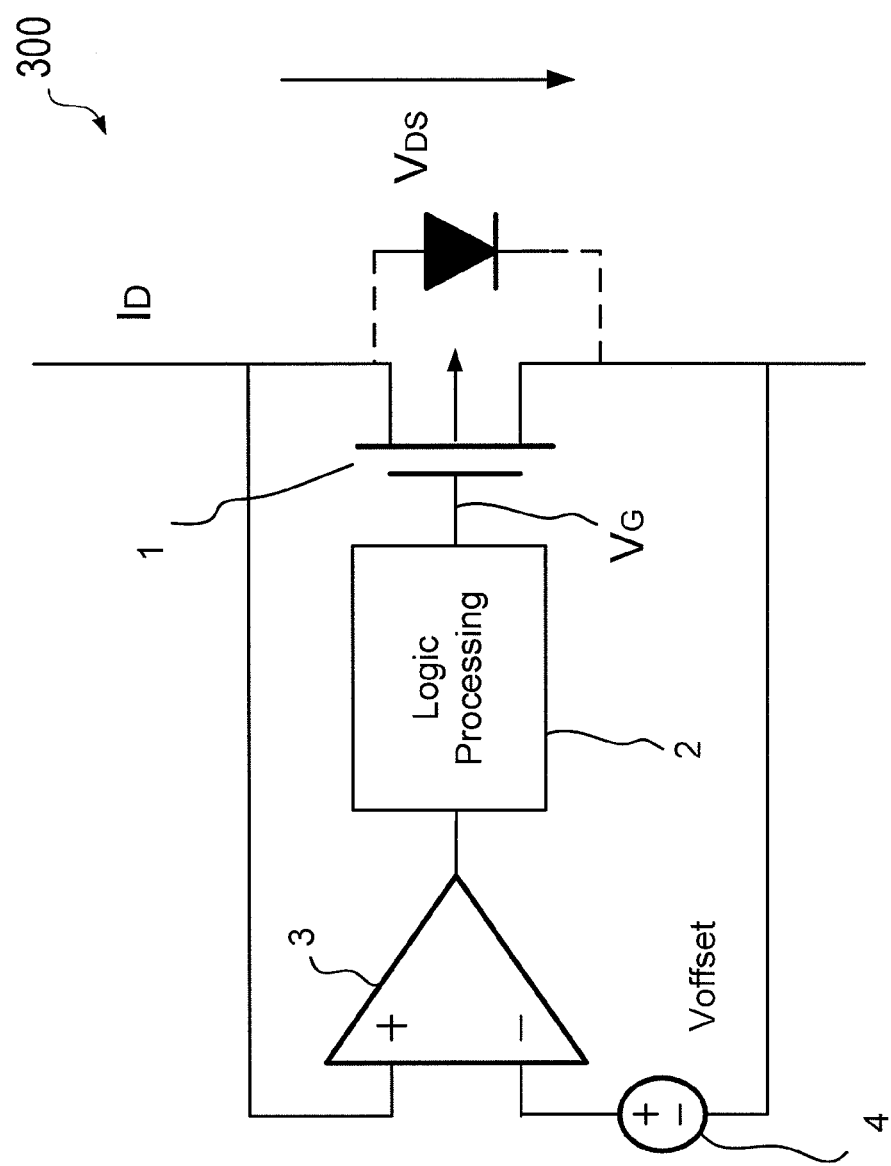
FIG. 3 is a block diagram of a synchronous rectifier according to an embodiment of the present invention.

FIG. 3 shows a synchronous rectifier 300 for a flyback power converter according to an embodiment of the present invention. In FIG. 3, synchronous rectifier 300 includes a voltage comparing unit 3 and a logic process unit 2. The synchronous rectifier also has a power MOSFET 1 serving as a power switch. Voltage comparing unit 3 has two differential inputs "+" and "−" coupled to the drain and source terminals, respectively, of MOSFET 1. An offset voltage source 4 is coupled between the inverting input of the comparator and the source terminal of the MOSFET 1. The offset source 4 is used to provide a reference voltage and set the threshold value for the comparator to respond to the voltage difference between the source and drain terminals of the MOSFET. By selecting the offset voltage source 4, the comparator can be designed to respond either before or after the voltage across the drain and source terminals of the MOSFET drops to zero, thereby preventing the back flow of current and reducing power loss. This offset source 4 can be integrated in the design of the comparator 3.

The output of the comparator 3 is coupled to logic processing unit 2. The output of the comparator is processed by logic processing unit 2 in a manner which will be described in details below. The output of logic processing unit 2, labeled $V_G$, is coupled to the driving terminal of the power switch, or the gate of MOSFET 1 in FIG. 3, which provides a gate-to-source voltage of the MOSFET 1, turning the MOSFET 1 on and off in response to the voltage drop across the MOSFET. The logic processing unit may also include a powerful driving circuit to quickly switch the MOSFET. In the embodiment of FIG. 3, the voltage across MOSFET 1 is sampled and compared to voltage reference 4. The comparison result is processed and used to control the on/off state of MOSFET 1.

Figure 4A:
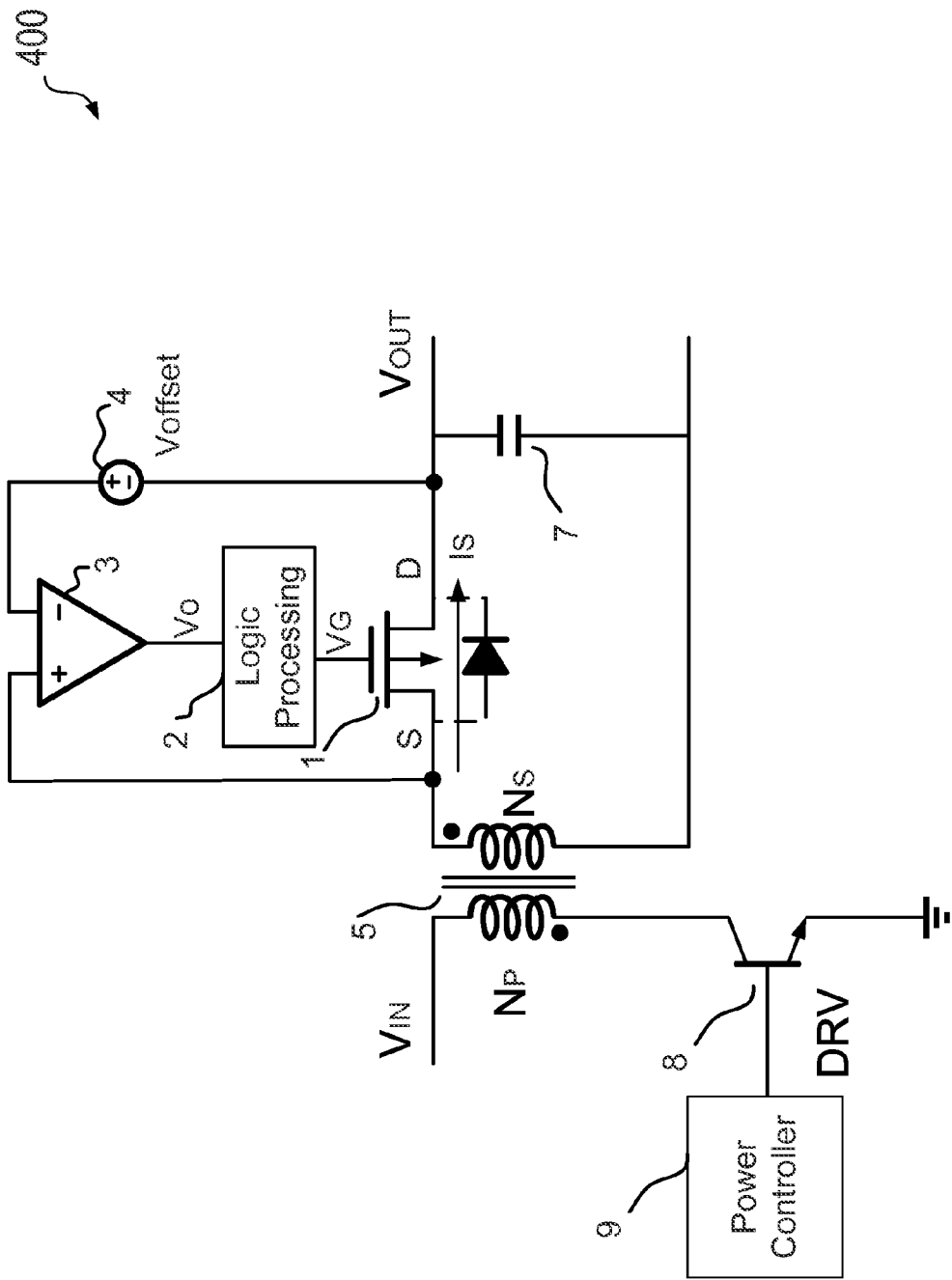
FIG. 4A is a schematic diagram of a flyback power converter incorporating an embodiment of synchronous rectifier, which uses a power PMOS.
Figure 4B:
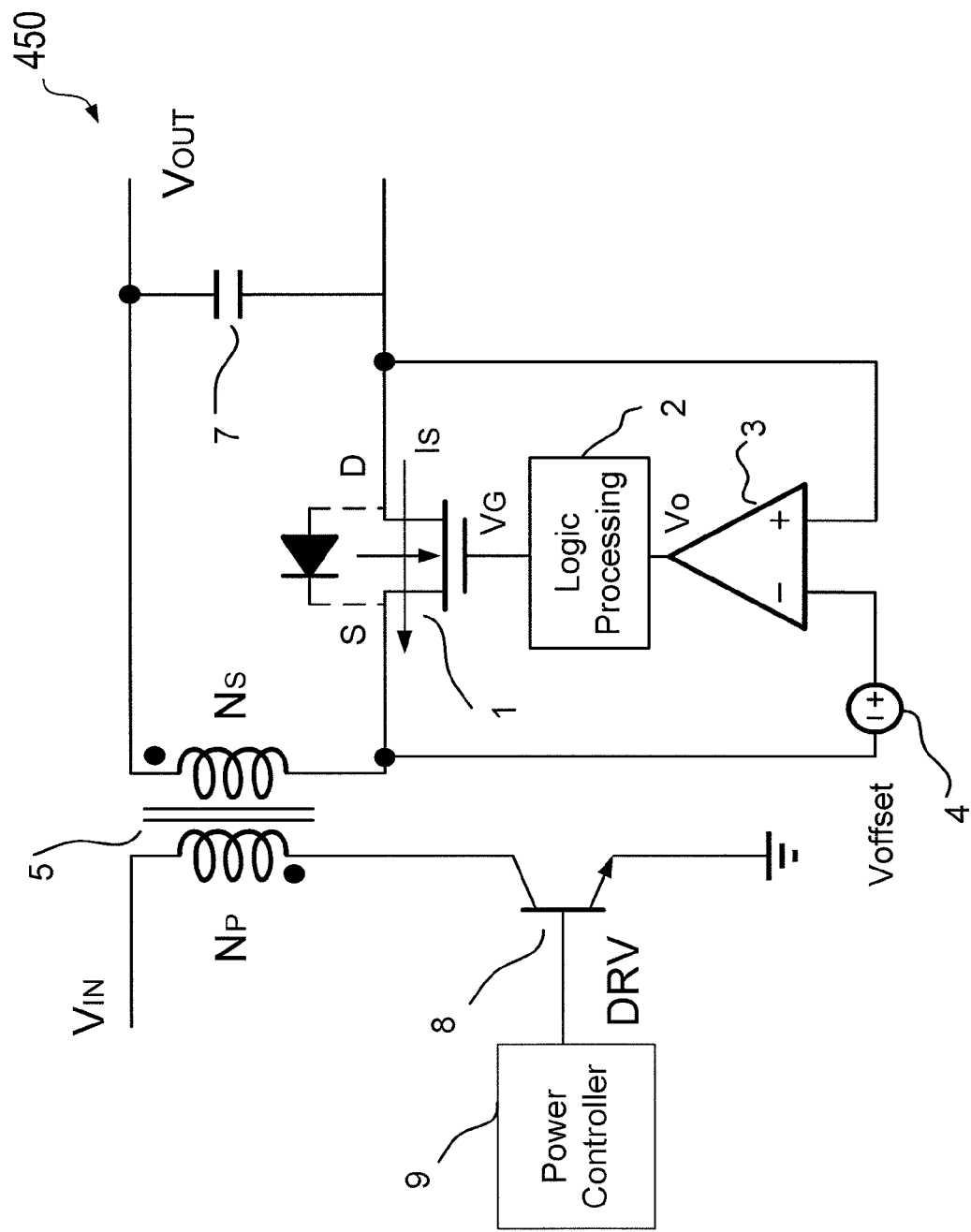
FIG. 4B is a schematic diagram of a flyback power converter incorporating another embodiment of synchronous rectifier, which uses a power NMOS.

FIG. 4A and FIG. 4B are schematic diagrams of two flyback power converters according to embodiments of the present invention. As shown, both flyback converters, 400 and 450, respectively, are configured with synchronous rectifying capabilities, each including a DC or rectified power source to provide input power required. The power source is coupled to the primary winding of a transformer 5 and a power switch 8. Power switch 8 is switched on/off by a power controller IC, labeled as 9. Controller 9 controls the power source to output a high frequency control signal DRV to power transistor 8 to regulate the current flow in transformer 5. As shown, transformer 5 has a primary winding and can have one or more secondary windings. When power switch 8 is turned off, the energy stored in the primary winding is transferred to the secondary windings and stored on an output capacitor 7. The secondary side includes the secondary winding coupled to a synchronous rectifier, e.g., as depicted in FIG. 3, and the output capacitor. It is noted that controller 400 in FIG. 4A uses a power PMOS 1 in the synchronous rectifier, whereas controller 450 in FIG. 4B uses a power NMOS 1 in the synchronous rectifier. Both PMOS 1 in FIG. 4A and NMOS 1 in FIG. 4B are shown to have a parasitic body diode.

Figure 5:
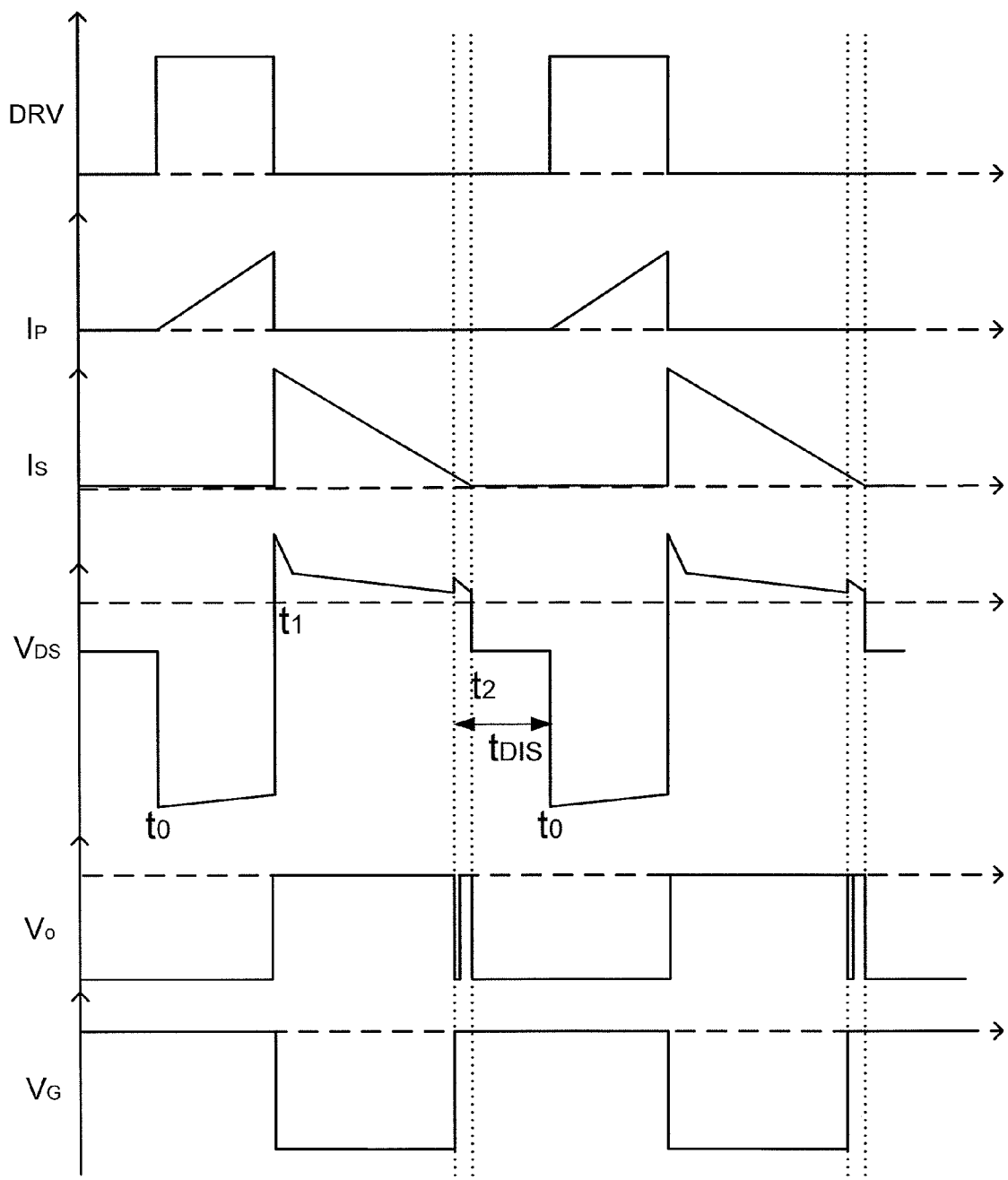
FIG. 5 is a waveform diagram illustrating the operation of the circuit shown in FIG. 4A.

FIG. 5 is a waveform diagram illustrating the operation of the converter in FIG. 4A according to an embodiment of the present invention. As shown, control signal DRV is provided by power controller 9 to a power switch 8. $I_P$ is the current of the primary winding of transformer 5, and $I_S$ is the output current in the secondary winding of transformer 5, and $V_{DS}$ is the voltage across the MOSFET 1.

In the discontinuous mode (DCM), the driving current to power switch 8 is applied from time t0 to t1 in FIG. 5. Current $I_P$ in the primary winding increases linearly from 0 to a peak value until power switch 8 is turned off by power controller 9. At this time, the primary side becomes an open loop, and the secondary winding current increases abruptly at the time instant t1. Before the synchronous rectifier circuits respond to turn on the MOSFET, the current flows through the parasitic body diode of the power MOSFET 1, creating a voltage drop about 0.7~1.2V across MOSFET 1's drain and source terminals. This voltage difference is sensed by the differential inputs of voltage comparing unit 3, which outputs an enable signal, which is processed by logic processing circuit 2 and turns on MOSFET 1. After MOSFET 1 is turned on, the current from the secondary winding flows through MOSFET 1, bypassing the body diode. The voltage drop across MOSFET 1 decreases to about 0.2V or less due to a small on resistance $R_{DS}(on)$. With the current decreasing linearly in the secondary winding, the voltage across the MOSFET also decreases. When the voltage across the MOSFET drops to a reference offset voltage Voffset provided by offset voltage circuit 4, the synchronous control circuit switches off MOSFET 1. After a short period of discontinuous state, labeled $t_{DIS}$ in FIG. 5, power switch 8 is turned on again by power controller 9, and the converter is back to the charging state. Thus, a switching cycle is completed.

In embodiments of the present invention, to prevent a current backflow from output capacitor 7, a voltage offset Voffset 4 is used to turn off the synchronous rectifier a little earlier than the change of $V_{DS}$. However, without the logic processing circuit 2, the voltage comparing unit 3 will output a disable signal turning off the synchronous rectifier directly. Then the current in the secondary winding will flow through the body diode of MOSFET 1, resulting a voltage drop of 0.7~1.2V, which will cause the voltage comparing unit 3 to switch on the synchronous rectifier again. The turning on of the synchronous rectifier will bypass the remaining current in the secondary winding, causing a small voltage drop across MOSFET 1. The synchronous rectifier will be switched on and off repeatedly, resulting in unnecessary power loss and reduction of power converting efficiency. The waveform $V_O$ in FIG. 5 illustrates the vibrating of the driving signal of the synchronous rectifier.

In order to eliminate the vibration phenomena in the controlling signal of the synchronous rectifier, a logic processing unit 2 is included in the embodiments of FIGS. 3, 4A, and 4B. The waveform $V_G$ in FIG. 5 shows the driving signal after logic processing unit 2, which illustrates the elimination of the vibration.

Figure 6:
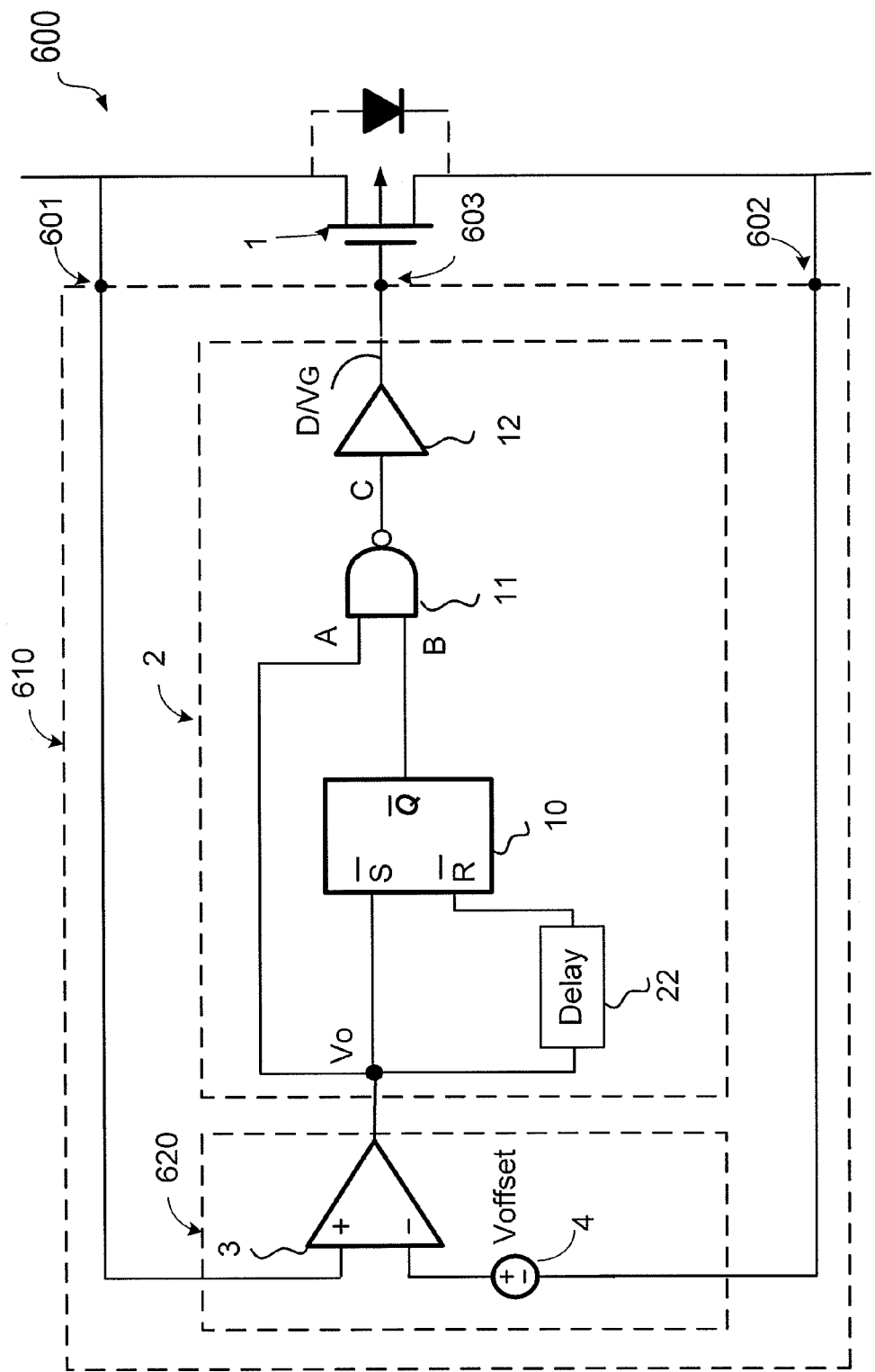
FIG. 6 is a block diagram of a synchronous rectifier including an exemplary logic processing unit 2 according to an embodiment of the invention.

FIG. 6 is a schematic diagram of a synchronous rectifier 600 according to an embodiment of the present invention that includes an exemplary embodiment of logic processing unit 2 shown, e.g., in FIG. 3, 4A or 4B. As shown, synchronous rectifier 600 includes a power switch 1, e.g., a power MOSFET, and a switching control circuit 610. In a power converter, power switch 1 is configured to be coupled to a transformer and an output capacitor, for example, as shown in FIGS. 4A and 4B. Switching control circuit 610 has a first input 601 and a second input 602 configured for coupling to a positive and a negative terminals of power switch 1 and for sensing a voltage across that power switch. Output terminal 603 of switching control circuit 610 is configured for outputting a signal D or $V_G$ to drive power switch 1.

Switching control circuit 610 has a logic processing unit 2 and a voltage comparing unit 620. In the embodiment of FIG. 6, voltage comparing unit 620 includes a comparator circuit 3, which is configured to act in response to the first and second inputs, and is configured to output a logic signal according to the voltage difference between the sensed voltage drop across the power switch and a reference threshold voltage provided by voltage offset circuit 4.

As shown in FIG. 6, logic processing circuit 2 is coupled to voltage comparing unit 3 and is configured to provide a first state and a second state of the voltage across the power switch. In an embodiment, the second state is determined prior to the first state is determined. In the embodiment of FIG. 6, the first state of the voltage across the power switch is the sampled value of the voltage at a given instance, and the second state is a value of the voltage across the power switch sampled at an earlier instance. The second state is a delayed sample of the value of the voltage across the power switch at the earlier instance. Switching control circuit 610 is configured to provide a control signal (D or $V_G$) to the power switch in response to the first state of a voltage across the power switch and the second state of the voltage across the power switch. Power switch 1 is turned on when the voltage across the power switch is larger than a reference threshold voltage. The power switch is turned on by the control signal for a period of time correlated to the voltage drop across the power switch.

In the example shown in FIG. 6, logic processing unit 2 includes a delay circuit 22, an RS flip-flop 10, a NAND gate 11, and a driving circuit 12. The output of comparator circuit 3, labeled Vo, is coupled to the S input of RS flip-flop 10, while a delayed Vo signal is input to the R input of flip-flop 10. In an embodiment, the delay time is set to be longer than the vibrating time and shorter than the discontinuous time $t_{DIS}$ described above in connection with FIG. 5. In some embodiments, the vibrating time and the discontinuous time can be determined experimentally. In other embodiments, the vibrating time and the discontinuous time can be determined by circuit analysis or simulation techniques. Merely as an example, in a power converter having a control signal operating at about 50 KHz, i.e., at a period of about 20 msec, the delay time may be 1-2 msec.

In FIG. 6, the output of flip-flop 10 is coupled to one of the inputs of NAND gate 11. The other input of NAND 11 is coupled directly to Vo, the output of comparator 3. The output terminal of NAND gate 11 is connected to a buffer 12 served as a driving circuit. In an application, this logic circuit can eliminate the vibration of the driving pulse in a PFM flyback converter. In some embodiments, driver 12 can be omitted. To improve the performance, logic processing unit 2 can be designed with minimum geometry logic gates to improve the response time of control circuit 610.

Figure 7:
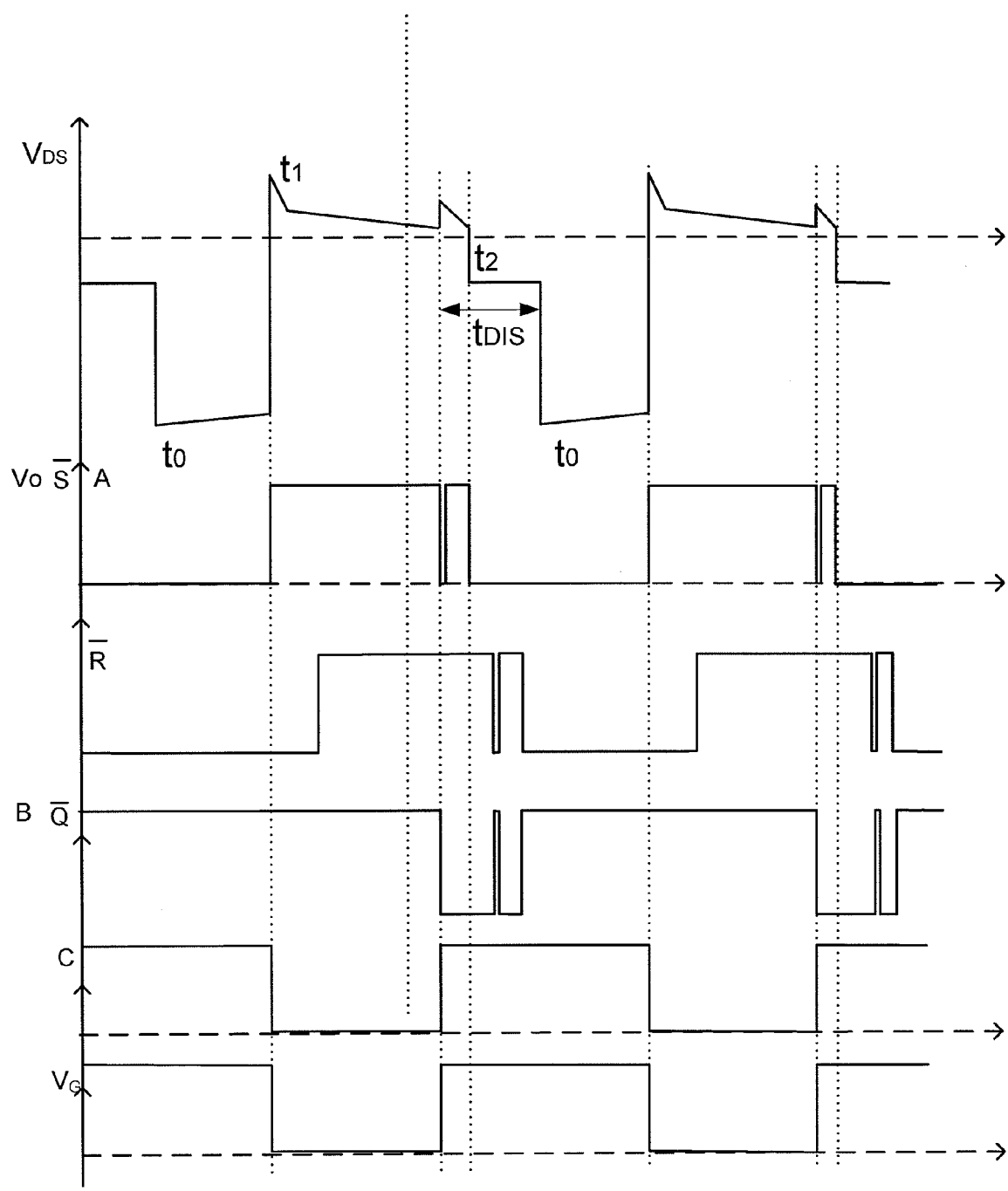
FIG. 7 is a waveform diagram illustrating the operation principle of the logic processing unit showing in FIG. 6.

FIG. 7 is a waveform diagram illustrating the operation of synchronous rectifier 600 shown in FIG. 6. At time t0, when the primary side of the transformer is conducting, the secondary side of the transformer has an induced reverse voltage. The body diode of MOSFET 1 is reverse biased and gives a low output at the node Vo, which sets the output node C of NAND gate 11 high, which turns off the synchronous rectifier. At t1, when Vo becomes high, both inputs A and B of NAND gate 11 are high, and an enable signal at node C turns on power switch 1. At the beginning of period t2, Vo falls to low, setting RS flip-flop 10. The output of flip-flop 10, signal B, disables NAND gate 11 and turns off the MOSFET 1. The voltage at Vo might rise and fall, and vibrate as explained above. However, logic processing unit 2 keeps control signal Vo from vibrating transient signals, as shown in FIG. 7. At the next t0, the primary side of the transformer is turned on again in the next switching cycle.

Figure 8:
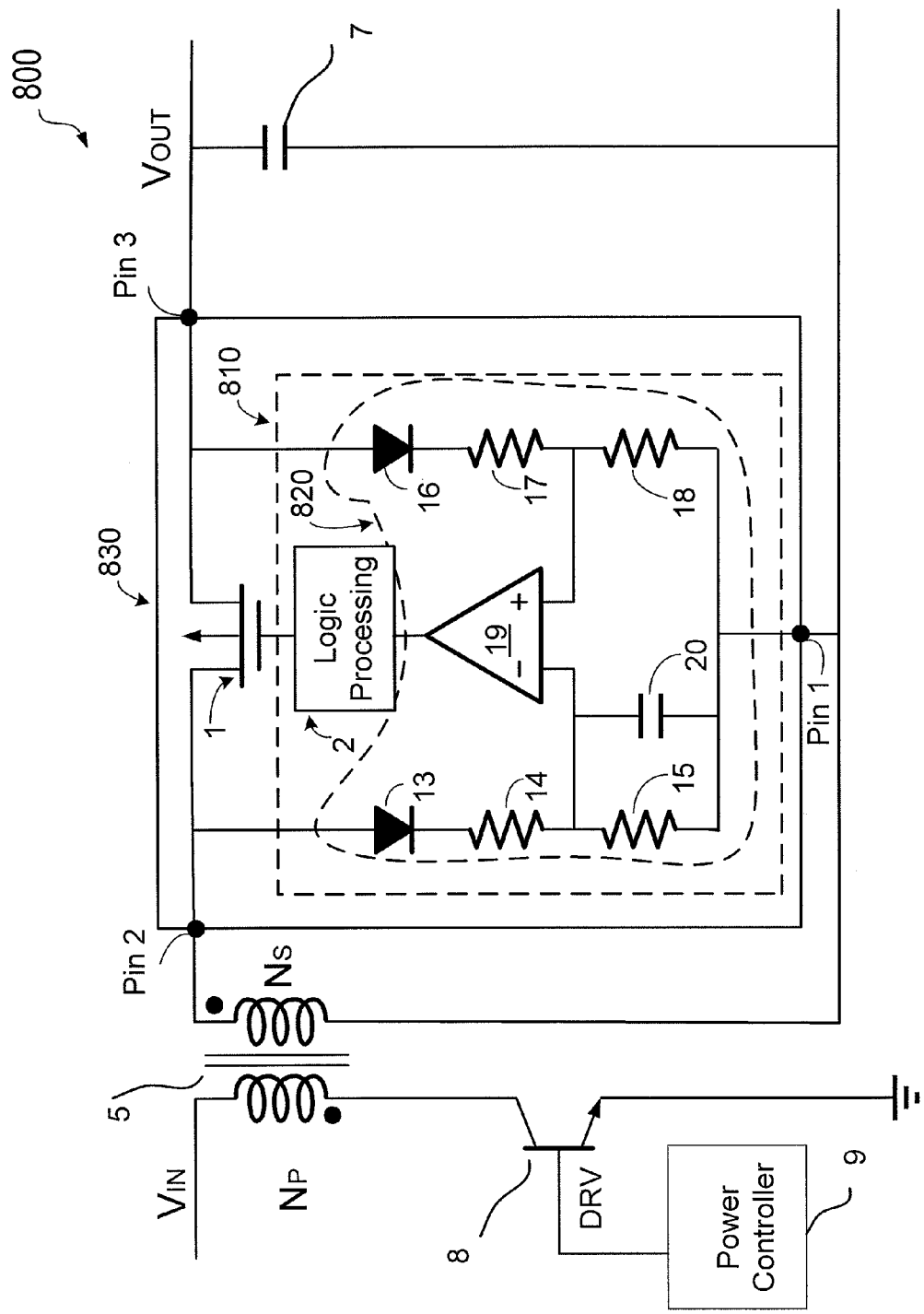
FIG. 8 shows a power converter having a synchronous rectifier that includes a low-voltage voltage comparing unit according to an embodiment of the present invention.

FIG. 8 illustrates a power converter 800 that includes a synchronous rectifier according to an alternative embodiment of the invention. As shown, power converter 800 has components similar to those of the power converter of FIG. 4A described above, including a transformer 5, a power controller 9, a power transistor 8, an output capacitor 7, and a synchronous rectifier 830. In some embodiments, synchronous rectifier 830 in FIG. 8 can be implemented as an integrated three-pin rectifier that includes a ground pin (Pin 1), an input pin 1 (Pin 2) which is coupled to a transformer 5 and serves for both voltage sensing and current input, and an output pin (Pin 3) coupled to an output terminal of the power converter, labeled Vout, which also serves as a power supply for the inner circuit of the rectifier. Of course, other configurations can also be used.

As shown in FIG. 8, synchronous rectifier 830 includes a power switch 1 coupled to the input pin, Pin 2, and the output pin, Pin 3, and a switching control circuit 810, which is configured to generate a control signal in response to a voltage difference between the voltage drop across power switch 1 and a reference threshold voltage. In an embodiment, the control signal is coupled to control power switch 1 and the enable period of the control signal, or the period of time when power switch 1 is turned on, is correlated to a forward voltage drop across the power switch. In an embodiment, switching control circuit 810 includes a logic processing circuit 2 and a voltage comparing circuit 820. Further, in some embodiments, switching control circuit 810 in rectifier 830 is powered by output pin, Pin 3, and ground pin, Pin 1.

In an embodiment, voltage comparing unit 820 includes a comparator circuit 19 and also includes a voltage offset circuit described below. Since voltage comparing unit 820 is exposed to high voltages from the secondary winding which can reach, for example, 40-50V or higher, a low-voltage comparator circuit, e.g., one rated for 5V operation, can not be directly connected to the terminals of power transistor 1. The embodiment of FIG. 8 provides voltage comparing unit 820 that can be fabricated in a standard CMOS technology, e.g., a 5V technology. As shown in FIG. 8, voltage comparing unit 820 has two branches of circuits each including a voltage divider along and a diode. As illustrated in FIG. 8, in the left branch, a diode 13 is coupled to the secondary winding of transformer 5 and a resistor 14. Resistor 14 is also coupled to the inverting input of a comparator 19. A resistor 15 and a capacitor 20 are connected to a second output terminal of converter 800. Resistors 13 and 14 are used as a voltage divider. When the secondary winding of transformer 5 has a positive voltage, the inverting input of comparator 19 senses this voltage and turns on power switch 1. When the secondary winding of the transformer 5 has a negative voltage, most of the voltage is applied to diode 13. The inverting input of comparator 19 senses a voltage near 0V, which is less than the non-inverting input of comparator 19, and MOSFET 1 is turns off. The right branch includes a diode 16 and resistors 17 and 18, and functions in a similar manner. A capacitor 20 is used to filter out the high frequency component of the input signal and protect comparator 19.

By adjusting the resistance values of resistors 14, 15, 17, and 18, the offset voltage 4, as shown in FIG. 4, can be obtained. In some embodiments, each of the resistors strings is used as a voltage divider, which is coupled to one of the output terminals. The resistor string sets the desired offset voltage and make sure the voltage input from comparator circuit 19 fall within the common mode input range of the comparator, which simplifies the design of the comparator. In certain embodiments, a diode is coupled to the resistor string and the input of the comparator circuit to prevent current back flow and protect the comparator.

In an embodiment, voltage comparing unit 820 in FIG. 8 is configured to scale the high voltage signals on the power switch such that a low-voltage comparator can be used in the control circuit. For example, in some embodiments, resistors 13 and 16 may have resistance value of about 150 KΩ, and resistors 14 and 17 may have resistance values of about 15 KΩ. In some embodiments, voltage comparing unit 820 of FIG. 8 can be provided in a separate low-voltage integrated circuit. In other embodiments, switching control circuit 810, which includes logic processing unit 2 and voltage comparing unit 820, can be provided in a separate low-voltage integrated circuit. In these embodiments, power transistor 1 can be provided in a separate high voltage IC chip.

In embodiments, in which a high-voltage BiCMOS technology is available, diodes 13 and 16 and resistors 14, 15, 17, and 18 would be not necessary. The voltage comparing unit 820 may include only one high-voltage comparator with a built-in system offset. The offset can be selected to suit a particular application.

Many advantages are provided by embodiments of the present invention over conventional approaches. For example, embodiments of the invention do not need any current transformer (CT) or Hall element. Some embodiments do not need additional elements for current sensing, reducing circuit complexity and power consumption. This will improve the performance of the power converter. In some embodiments of the invention, the synchronous controller and the MOSFET switch can be integrated into one single IC with only three pins to replace the rectifying diode, which can have a much lower cost than conventional synchronous rectifying schemes.

While this invention has been described in connection with specific embodiments, it is to be understood that the invention is not limited to the disclosed embodiments. It will be apparent to those skilled in the art that various modifications and variations can be made to the embodiments of the present invention.

What is claimed is:

1. A synchronous rectification circuit for a power converter, comprising:
    a power switch including a body diode and configured as a synchronous rectifier for coupling to a transformer and an output capacitor; and
    a switching control circuit configured to provide a control signal in response to a first voltage signal related to a voltage across the power switch and a second voltage signal which is a delayed version of the first voltage signal;
    wherein the switching control circuit is configured to provide the control signal to the synchronous rectifier without any other-input signal that provides information about an operating state of the power converter;
    wherein the switching control circuit comprises:
    first and second inputs, configured for coupling to a positive and a negative terminals of the power switch and sensing a voltage across that power switch;
    an output terminal, configured for outputting a signal to drive the power switch;
    a voltage comparing unit, configured to act in response to the first and second inputs, wherein the voltage comparing unit is configured to output a logic signal according to the voltage difference between the sensed voltage drop across the power switch and a reference threshold voltage; and
    a logic processing circuit, coupled to the voltage comparing unit and configured to provide the first voltage signal and the second voltage signal;
    where the logic process unit comprises:
    an input terminal for receiving an input signal;
    a delay module coupled to the input terminal;
    an SR flip-flop coupled to the input terminal and the delay module;
    a NAND logic gate coupled to the input terminal and the SR flip-flop; and
    a drive circuit coupled to the output of the logic processing unit and the output terminal of the synchronous rectification circuit,
    wherein the delay module is configured to provide a delay time between the determination of the first voltage signal and the second voltage.

2. The circuit of claim 1, wherein the voltage comparing unit comprises a comparator in high voltage process having a built in system offset that is used as the reference threshold voltage.

3. The circuit of claim 1, wherein the power switch is provided in a first integrated circuit chip, and the switching control circuit is included in a second integrated circuit chip.

4. The circuit of claim 1, wherein the synchronous rectification circuit is powered by a single power supply.

5. The circuit of claim 1, wherein the synchronous rectification circuit is powered by the output of a flyback converter.

6. The circuit of claim 1, wherein the power switch is a P type MOSFET or an N type MOSFET.

7. The circuit of claim 6, wherein the MOSFET has a parasitic body diode, which serves as a rectification diode.

8. The synchronous rectification circuit as claimed in claim 1, wherein the switching control circuit is configured to provide the control signal to the synchronous rectifier without any other-input signal from a transformer, a Hall effect device, or a current sensing transistor.

9. A synchronous rectification circuit for a power converter, comprising:
    a power switch including a body diode and configured as a synchronous rectifier for coupling to a transformer and an output capacitor; and
    a switching control circuit configured to provide a control signal in response to a first voltage signal related to a voltage across the power switch and a second voltage signal which is a delayed version of the first voltage signal;
    wherein the switching control circuit is configured to provide the control signal to the synchronous rectifier without any other-input signal that provides information about an operating state of the power converter;
    wherein the switching control circuit comprises:
    first and second inputs, configured for coupling to a positive and a negative terminals of the power switch and sensing a voltage across that power switch;
    an output terminal, configured for outputting a signal to drive the power switch;
    a voltage comparing unit, configured to act in response to the first and second inputs, wherein the voltage comparing unit is configured to output a logic signal according to the voltage difference between the sensed voltage drop across the power switch and a reference threshold voltage; and
    a logic processing circuit, coupled to the voltage comparing unit and configured to provide the first voltage signal and the second voltage signal;
    wherein the voltage comparing unit comprises:
    a comparator having two inputs; and
    two voltage divider circuits, each of the voltage divider circuits including:
        a resistor string configured as a voltage divider and coupled to the power switch, the resistor string is configured to set a desired offset voltage and to cause the voltage input from the voltage comparing unit to fall into a common mode input range of the comparator; and
        a diode coupled to the resistor string and configured to prevent current back flow,
    wherein each of the two inputs of the comparator is coupled to an internal node of each of the voltage dividers, respectively.

10. The circuit of claim 9, wherein the power switch is provided in a high-voltage integrated circuit chip, and the switching control circuit is included in a low-voltage integrated circuit chip.

11. A switching control circuit for a synchronous rectifier, comprising:
    first and second inputs, configured for coupling to a positive and a negative terminals of a power switch including a body diode and configured as a synchronous rectifier and sensing a voltage across that power switch;
    an output terminal, configured for outputting a signal to drive the power switch;
    a voltage comparing unit, configured to act in response to the first and second inputs, wherein the voltage comparing unit is configured to output a logic signal according to the voltage difference between the sensed voltage drop across the power switch and a reference threshold voltage; and a logic processing circuit, coupled to the voltage comparing unit and configured to provide a control signal according to a first voltage signal related to a voltage across the power switch and a second voltage signal which is a delayed version of the first voltage signal, wherein the first voltage signal and the second voltage signal each includes a vibrating portion caused by switching of the body diode and the control signal is free from a vibrating portion.

12. The circuit of claim 11, where the logic process unit comprises:
   an input terminal for receiving an input signal;
   a delay module coupled to the input terminal;
   an SR flip-flop coupled to the input terminal and the delay module;
   a NAND logic gate coupled to the input terminal and the SR flip-flop; and
   a drive circuit coupled to the output of the logic processing unit and the output terminal of the synchronous rectification circuit,
   wherein the delay module is configured to provide a delay time between the determination of the first voltage signal and the second voltage signal.

13. The circuit of claim 11, wherein the voltage comparing unit comprises:
   a comparator having two inputs; and
   two voltage divider circuits, each of the voltage divider circuits including:
      a resistor string configured as a voltage divider and coupled to the power switch, the resistor string being configured to set a desired offset voltage and to cause the voltage input from the voltage comparing unit to fall into a common mode input range of the comparator; and
      a diode coupled to the resistor string and configured to prevent current back flow;
   wherein each of the two inputs of the comparator is coupled to an internal node of each of the voltage dividers, respectively.

14. The circuit of claim 11 wherein the switching control circuit is included in a low-voltage integrated circuit chip.

15. A synchronous rectification circuit for a power converter, comprising:
   a power switch, coupled to a transformer and an output capacitor; and
   a switching control circuit configured to provide a control signal to the power switch in response to a first voltage signal related to a voltage across the power switch and a second voltage signal which is a delayed version of the first voltage signal;
   wherein the switching control circuit comprises:
   first and second inputs, configured for coupling to a positive and a negative terminals of the power switch and sensing a voltage across that power switch;
   an output terminal, configured for outputting a signal to drive the power switch;
   a voltage comparing unit, configured to act in response to the first and second inputs, wherein the voltage comparing unit is configured to output a logic signal according to the voltage difference between the sensed voltage drop across the power switch and a reference threshold voltage; and
   a logic processing circuit, coupled to the voltage comparing unit and configured to provide the first voltage signal and the second voltage signal, where the logic process unit comprises:
   an input terminal for receiving an input signal;
   a delay module coupled to the input terminal;
   an SR flip-flop coupled to the input terminal and the delay module;
   a NAND logic gate coupled to the input terminal and the SR flip-flop; and
   a drive circuit coupled to the output of the logic processing unit and the output terminal of the synchronous rectification circuit,
   wherein the delay module is configured to provide a delay time between the determination of the first voltage signal and the second voltage signal.

16. The circuit of claim 15, wherein the voltage comparing unit comprises:
   a comparator having two inputs; and
   two voltage divider circuits, each of the voltage divider circuits including:
      a resistor string configured as a voltage divider and coupled to the power switch, the resistor string is configured to set a desired offset voltage and to cause the voltage input from the voltage comparing unit to fall into a common mode input range of the comparator; and
      a diode coupled to the resistor string and configured to prevent current back flow,
   wherein each of the two inputs of the comparator is coupled to an internal node of each of the voltage dividers, respectively.

* * * * *